United States Patent

Park et al.

[11] Patent Number: 5,745,149
[45] Date of Patent: Apr. 28, 1998

[54] THERMAL PRINTING HEAD

[75] Inventors: Sung-soo Park, Suwon; Hong-geun Yang, Seoul, both of Rep. of Korea

[73] Assignee: Samsung Electronics Co., Ltd., Suwon, Rep. of Korea

[21] Appl. No.: 743,148

[22] Filed: Oct. 4, 1996

[30] Foreign Application Priority Data

Nov. 2, 1995 [KR] Rep. of Korea ............... 95-39448

[51] Int. Cl.$^6$ ............................... B41J 2/335
[52] U.S. Cl. ............................... 347/208
[58] Field of Search ............... 347/208, 209, 347/210

[56] References Cited

U.S. PATENT DOCUMENTS

| | | | |
|---|---|---|---|
| 4,506,272 | 3/1985 | Arai | 347/210 |
| 4,595,934 | 6/1986 | Arai et al. | 347/210 |
| 4,651,164 | 3/1987 | Abe et al. | 347/210 |
| 5,003,324 | 3/1991 | Yoshike et al. | 347/208 |
| 5,280,301 | 1/1994 | Ota et al. | 347/209 |
| 5,285,216 | 2/1994 | Ota et al. | 347/209 |

FOREIGN PATENT DOCUMENTS

| | | | |
|---|---|---|---|
| 1-133756 | 5/1989 | Japan | 347/208 |
| 3-161361 | 7/1991 | Japan | 347/208 |
| 6-155786 | 6/1994 | Japan | 347/208 |

*Primary Examiner*—Huan H. Tran
*Attorney, Agent, or Firm*—Jones & Volentine, L.L.P.

[57] ABSTRACT

A thermal printing head of a printing apparatus is provided. The thermal printing head includes an alumina substrate on which a plurality of heat resistors and signal supplying aluminum pattern elements are formed, a print circuit board for supplying an electric signal and power to the heat resistors, which is located adjacent to the alumina substrate, a heat sink for discharging heat, wherein the heat sink is attached to the bottom of the print circuit board and the alumina substrate; and a driving IC mounted on the alumina substrate, each signal supplying aluminum pattern element thereof being formed of two portions having different widths which are alternately connected in a lengthwise direction along the signal supplying aluminum pattern. This arrangement minimizes or prevents contamination of the wire bonding pad due to bleeding of solder resist and non-conductive epoxy along the signal supplying aluminum pattern element during manufacturing processes.

3 Claims, 1 Drawing Sheet

THERMAL PRINTING HEAD

BACKGROUND OF THE INVENTION

The present invention relates to a thermal printing head (TPH) of a printing apparatus, and more particularly to a thermal printing head comprising a signal supplying aluminum pattern which can prevent a wire bonding pad from becoming contaminated during manufacturing of the printing head.

The thermal printing head is for obtaining an image using a direct thermal printing or a thermal transfer printing method. A driving integrated circuit (driving IC) for driving a heat resistor is mounted on the thermal printing head. There are two methods used for mounting the driving IC: one is to mount the driving IC on an alumina ($Al_2O_3$) substrate and the other is to mount the driving IC on a printed circuit board (PCB).

FIG. 1 is a cross-sectional view illustrating a thermal printing head in which the driving IC is mounted on an alumina substrate and may be described in detail as follows.

Reference numeral 10 in FIG. 1 represents an alumina substrate on which a heat resistor and a signal supplying aluminum pattern (not shown) are formed. Reference numeral 20 represents a PCB, which is located adjacent to alumina substrate 10, for supplying an electric signal and power to the heat resistor. Reference numeral 30 represents a heat sink for discharging heat, which is attached to the bottom of PCB 20 and alumina substrate 10. And, reference numeral 40 represents a driving IC for selectively driving the heat resistor to generate heat, which is formed on the signal supplying aluminum pattern formed on alumina substrate 10.

Image data is converted into an electric signal in PCB 20 and a corresponding heat resistor generates heat according to the electric signal. Consequently, the image is printed on thermosensitive paper which is contacted with the printing head to cause the heat generated patterned image to be transferred to the paper.

FIG. 2 is a plane view showing a driving IC and a plurality of signal supplying aluminum patterns of a conventional thermal printing head. Therein, reference numeral 5 represents a wire bonding pad formed on the alumina substrate, for attaching an electric signal supplying wire. Reference numeral 15 represents a signal supplying aluminum pattern element connected to wire bonding pad 5 which is formed on the alumina substrate, for supplying the electric signal to a heat resistor (not shown). Reference numeral 40 represents a driving IC for selectively driving the heat resistor to generate heat, which is mounted on a plurality of signal supplying aluminum pattern element 15, and reference numeral 45 represents a solder resist deposition surface for insulating driving IC 40 from signal supplying aluminum pattern element 15.

However, during a solder resist deposition process utilized in the manufacturing of a conventional thermal printing head, a bleeding phenomenon occurs. As a result of such phenomenon solder resist bleeding occurs along the length of signal supplying aluminum pattern element 15 and thereby contaminating wire bonding pad 5. As a result, the following wire bonding process cannot be performed smoothly. Also, during a die attaching process step for attaching driving IC 40 to solder resist deposition surface 45 using a non-conductive epoxy (not shown), the epoxy bleeds along signal supplying aluminum pattern element 15, to cause the wire bonding pad 5 to become contaminated.

If the interval distance between driving IC 40 and wire bonding pad 5 is lengthened to avoid such contamination of bonding pad 5, a wider alumina substrate is required. Thus, such problems serve as an obstacle to minimizing the size of the thermal printing head and raise the manufacturing costs for producing such thermal printing heads.

SUMMARY OF THE INVENTION

It is an object of the present invention to provide a thermal printing head comprising a plurality of signal supplying aluminum pattern elements of a signal pattern, which can substantially prevent a wire bonding pad from being contaminated during procedures for manufacturing the thermal printing head.

To achieve the above object, there is provided a thermal printing head comprising: an alumina substrate on which a plurality of heat resistors and signal supplying aluminum pattern elements are formed; a printed circuit board, which is located adjacent to the alumina substrate, for supplying an electric signal and power to the heat resistor; a heat sink for discharging heat, the heat sink being attached to the bottom of the printed circuit board and the alumina substrate; and a driving IC mounted on the alumina substrate, wherein each signal supplying aluminum pattern element is formed of two portions with each of the two portions having different widths which are alternately connected in a lengthwise direction with respect to the signal supplying aluminum pattern element, which is adapted thus to prevent the bleeding of solder resist and an epoxy during manufacturing procedures.

It is preferable that each signal supplying aluminum pattern element is formed of a first width portion and a second width portion, the first width portion being wider than the second width portion, wherein the two different portions are alternately connected in a lengthwise direction along the signal supplying aluminum pattern element.

According to the present invention, since the solder resist and the epoxy become dried up while remaining stationary at the portion of the signal supplying aluminum pattern element having larger width, a wire bonding pad is not contaminated.

DETAILED DESCRIPTION OF THE INVENTION

The above objects and advantages of the present invention will become more apparent by a detailed description below of preferred embodiments and by reference to the attached drawings.

Figure 1:
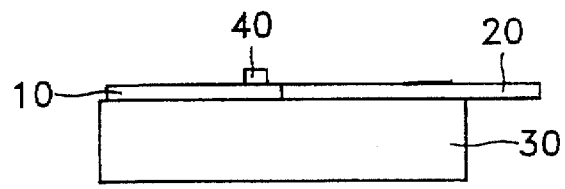
FIG. 1 is a cross-sectional view of a general thermal printing head.
Figure 2:
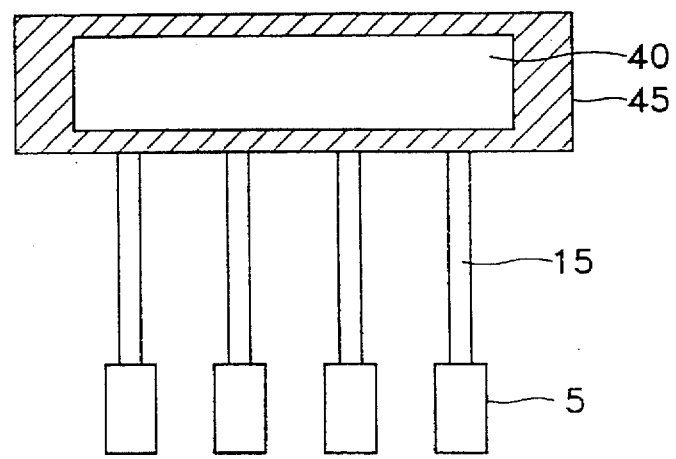
FIG. 2 is a plane view showing a driving IC and a plurality of signal supplying aluminum patterns of a conventional thermal printing head.
Figure 3:
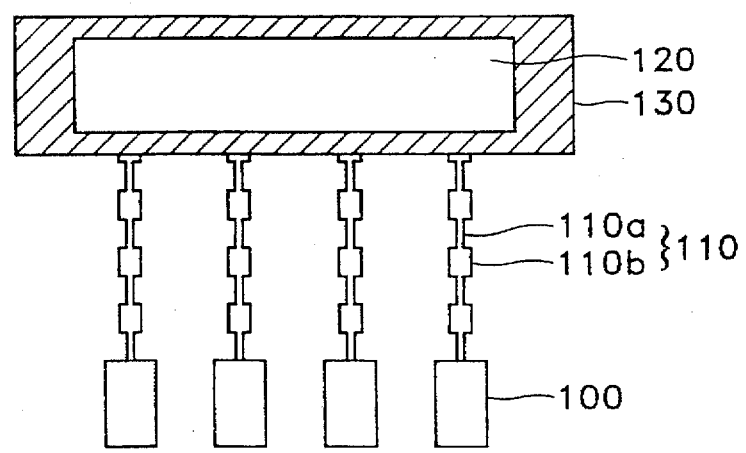
FIG. 3 is a plane view showing a driving IC and a plurality of signal supplying aluminum patterns of a thermal printing head according to the present invention.

FIG. 3 illustrates a preferred embodiment of the present invention having a driving IC and a signal supplying aluminum pattern elements portion of a thermal printing head according to the present invention. In FIG. 3, reference numeral 100 represents a wire bonding pad formed on an alumina substrate, for attaching a wire for transmitting an electric signal from a PCB (not shown). Reference numeral 110 represents a signal supplying aluminum pattern element formed on the alumina substrate and connected to wire bonding pad 100, for supplying the electric signal to a heat resistor (not shown). Reference numeral 120 represents a driving IC mounted on signal supplying aluminum pattern element 110 for driving the heat resistor. And, reference numeral 130 represents a solder resist deposition surface, wherein the solder resist is deposited for insulating driving IC 120 from signal supplying aluminum pattern elements 110.

In the preferred embodiment of the present invention as shown in FIG. 3, a signal supplying aluminum pattern element 110 (which is connected to wire bonding pad 100) is formed of a first width portion 110a and a second width portion 110b, which portions are alternately connected lengthwise along the signal supplying aluminum pattern element 110.

Solder resist and non-conductive epoxy which bleed along such signal supplying aluminum pattern element 110 during the solder resist deposition and die attachment processes are dried up while remaining stationary at second width portion 110b having wider width than first width portion 110a of the signal supplying aluminum pattern. With such an arrangement of the alternating width portions of pattern element 110, the contamination of wire bonding pad 100 can substantially be prevented.

Consequently, a later failure of the printing head due to contamination remaining from the following wire bonding process can be avoided without lengthening the distance between the driving IC and the wire bonding pad. By omitting the need for lengthening such distance, it is possible to avoid increases in the manufacturing costs and obstacles which hamper efforts towards minimization of the thermal printing head.

The present invention has been described in detail with reference to the above embodiments, but the present invention is not restricted to such embodiments. It is clearly contemplated and understood that many variations are possible within the scope and spirit of the present invention by persons who are skilled in the art. Further, such variations are intended to be within the scope of the invention and within the scope of the appended claims.

What is claimed is:

1. A thermal printing head comprising:
   an alumina substrate on which a plurality of heat resistors and signal supplying pattern elements are formed;
   a printed circuit board, which board is located adjacent to said alumina substrate, for supplying an electric signal and power to each of said heat resistors;
   a heat sink for discharging heat, said heat sink being attached to the bottom of said printed circuit board and said alumina substrate;
   a driving IC mounted on said alumina substrate; and
   a solder resist deposition surface for insulating said driving IC from said signal supplying pattern elements,
   wherein each of said signal supplying pattern elements is formed of two portions having different widths which are alternately connected in a lengthwise direction along each of said signal supplying pattern elements to minimize or prevent bleeding of a solder resist and an epoxy along the length of each of said signal supplying pattern elements during steps to manufacture said printing head.

2. A thermal printing head as claimed in claim 1, wherein each of said signal supplying pattern elements is formed of first width portion and a second width portion, said first width portion being wider than said second width portion, which different portions are alternately connected in a lengthwise direction along each of said signal supplying pattern elements.

3. A thermal printing head as claimed in claim 2, wherein each of said signal supplying pattern elements comprises a plurality of sets formed of the first width portion and second width portion, said sets alternately connected in a lengthwise direction along each of said signal supplying pattern elements.

* * * * *